(12) United States Patent
Morita

(10) Patent No.: US 8,711,562 B2
(45) Date of Patent: Apr. 29, 2014

(54) ROBOT CONTROL DEVICE

(75) Inventor: Hirotaka Morita, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 185 days.

(21) Appl. No.: 13/358,521

(22) Filed: Jan. 26, 2012

(65) Prior Publication Data

US 2012/0229979 A1    Sep. 13, 2012

(30) Foreign Application Priority Data

Mar. 8, 2011   (JP) .................................. 2011-049833

(51) Int. Cl.
*H05K 7/20*    (2006.01)

(52) U.S. Cl.
USPC .......................................... 361/695; 361/692

(58) Field of Classification Search
USPC .................. 361/679.48, 679.5, 692, 694–695
See application file for complete search history.

(56) References Cited

U.S. PATENT DOCUMENTS 4,383,286 A * 5/1983 Hicks ............................ 361/695

FOREIGN PATENT DOCUMENTS

| EP | 1793289 | 6/2007 | | |
|---|---|---|---|---|
| JP | 62-282498 | 12/1987 | | |
| JP | 05-198156 | 8/1993 | | |
| JP | 06-284522 | 10/1994 | | |
| JP | 08-203264 | 8/1996 | | |
| JP | 09-130072 | 5/1997 | | |
| JP | 10-261884 | 9/1998 | | |
| JP | 2000-151165 | 5/2000 | | |
| JP | 2000151168 A | * 5/2000 | ............... | H05K 7/20 |
| JP | 2000-223868 | 8/2000 | | |
| JP | 2001-127476 | 5/2001 | | |
| JP | 2005-019562 | 1/2005 | | |
| JP | 2006-167834 | 6/2006 | | |
| JP | 2007-144590 | 6/2007 | | |
| JP | 2007-175858 | 7/2007 | | |
| JP | 2007-257792 | 10/2007 | | |
| JP | 2009-283064 | 12/2009 | | |

OTHER PUBLICATIONS

Japanese Office Action for corresponding JP Application No. 2011-049833, Apr. 23, 2013.
Extended European Search Report for corresponding EP Application No. 12152359.1-1803, Dec. 12, 2013.
Japanese Office Action for corresponding JP Application No. 2011-049833, Aug. 6, 2013.

* cited by examiner

*Primary Examiner* — Robert J Hoffberg

(74) *Attorney, Agent, or Firm* — Ditthavong Mori & Steiner, P.C.

(57) ABSTRACT

A robot control device according to one aspect of the embodiment includes a casing, a control circuit, and a fan. The control circuit is allocated in the inside of the casing and controls a robot to be controlled. In the casing, an intake portion is arranged in a top plate and one side plate, and an exhaust portion is arranged in a side plate adjacent to the side plate in which the intake portion is arranged. Further, the fan releases outside air sucked into the casing from the intake portion to the outside of the casing through the exhaust portion.

6 Claims, 7 Drawing Sheets

ROBOT CONTROL DEVICE

CROSS-REFERENCE TO RELATED APPLICATION

This application is based upon and claims the benefit of priority of the prior Japanese Patent Application No. 2011-049833, filed on Mar. 8, 2011, the entire contents of which are incorporated herein by reference.

FIELD

The embodiment discussed herein is directed to a robot control device.

BACKGROUND

Conventionally, there has been known a robot control device that is connected to a robot to be controlled and controls the action of the robot. In such a robot control device, a control circuit that controls the action of the robot is generally arranged in the inside of a box-shaped casing (for example, see Japanese Patent Application Laid-open No. 2007-175858).

However, in the conventional robot control device, there has been a drawback that the operating environment of the control circuit is deteriorated when operating.

To be more specific, the control circuit includes a plurality of circuit elements such as an amplifier that amplifies a control signal output to the robot, and the circuit elements generate heat when operating. Accordingly, in the conventional robot control device, there exists a case that the temperature in the inside of the casing is increased by the heat generated from the circuit elements when operating thus deteriorating the operating environment of the control circuit.

SUMMARY

A robot control device according to an aspect of an embodiment includes: a casing, a control circuit and a fan. The casing including a top plate and one side plate provided with intake portions, respectively; The control circuit that is allocated in the inside of the casing and controls a robot to be controlled; and The fan releasing outside air sucked into the inside of the casing from the intake portions to the outside of the casing through an exhaust portion, wherein the exhaust portion is arranged in a side plate adjacent to the side plate provided with the intake portion.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENT

Hereinafter, an embodiment of a robot control device disclosed in the present application is explained in detail in conjunction with attached drawings. Here, the present invention is not limited to examples in the embodiment described below. Further, hereinafter, the embodiment is explained by taking the robot control device that controls a robot having a 7-axis robot arm provided with a robot hand on a distal end portion thereof as an example. However, a robot to be controlled is not limited to the robot described above.

Figure 1:
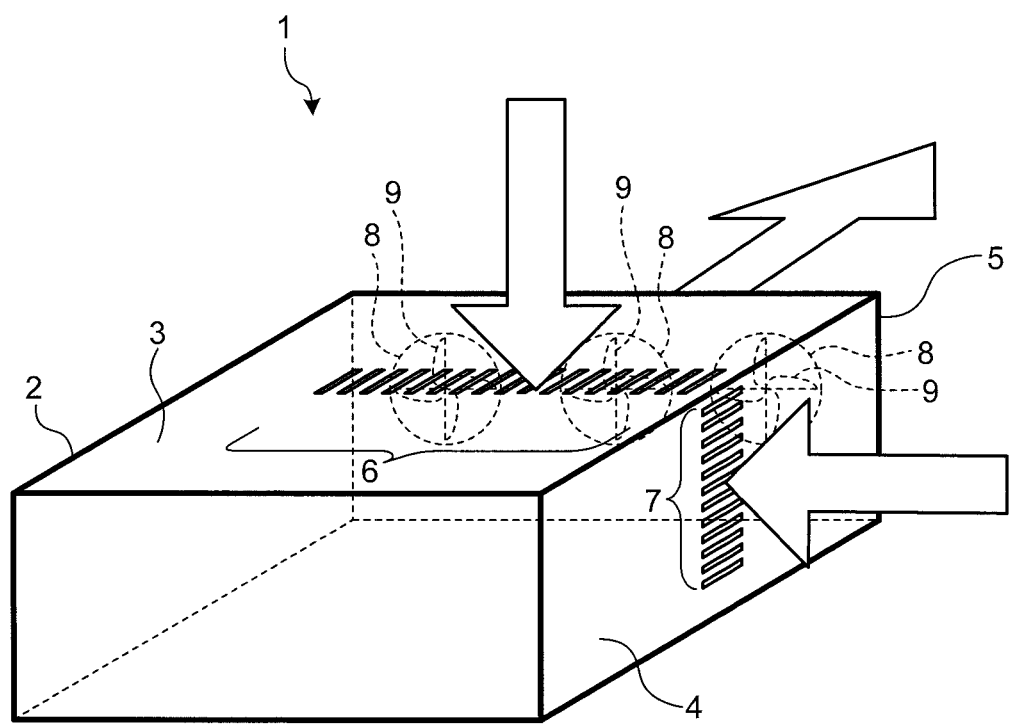
FIG. 1 is a schematic view illustrating a robot control device according to an embodiment.

FIG. 1 is a schematic view illustrating the robot control device 1 according to the embodiment. Here, in FIG. 1, an internal structure of the robot control device 1 is not illustrated in the drawing. The internal structure of the robot control device 1 is explained later in conjunction with FIG. 2 and FIG. 3.

As illustrated in FIG. 1, the robot control device 1 includes a casing 2 having a top plate 3 in which an intake portion 6 is arranged, one side plate 4 in which an intake portion 7 is also arranged, and a side plate 5 in which exhaust portions 8 are arranged, wherein the side plate 5 is adjacent to the side plate 4 in which the intake portion 7 is arranged.

Further, the robot control device 1 includes a control circuit 40 that includes a plurality of circuit elements (see FIG. 2 and FIG. 3) that are allocated in the inside of the casing 2 and control a robot to be controlled, and fans 9 that release outside air sucked into the inside of the casing 2 from intake portions 6 and 7 to the outside of the casing 2 through the exhaust portions 8.

Due to such a constitution, the robot control device 1 has an L-shaped passage formed in the inside of the casing 2 so that the outside air is moved from the intake portions 6 and 7 to the exhaust portions 8 by driving the fans 9. Accordingly, in the robot control device 1, heat inside the casing 2 is absorbed by the outside air passing through such a passage, and the outside air that accumulates the heat is released to the outside of the casing 2.

In this manner, the robot control device 1 is capable of suppressing a temperature increase inside the casing 2 by releasing the heat generated by the circuit elements allocated in the inside of the casing 2 to the outside of the casing 2 thus suppressing deterioration in the operating environment of the control circuit 40 due to the temperature increase inside the casing 2.

In addition, in the robot control device 1, neither the intake portion 7 nor the exhaust portion 8 is arranged in two side plates out of four side plates of the casing 2. Therefore, the robot control device 1 is installed in such a way that the side plate in which the intake portion 7 and the exhaust portions 8 are not arranged faces an operating side of the robot and hence, it is possible to release the heat generated in the inside of the casing 2 to the outside of the casing 2 without impairing an appearance of the robot control device 1.

Figure 2:
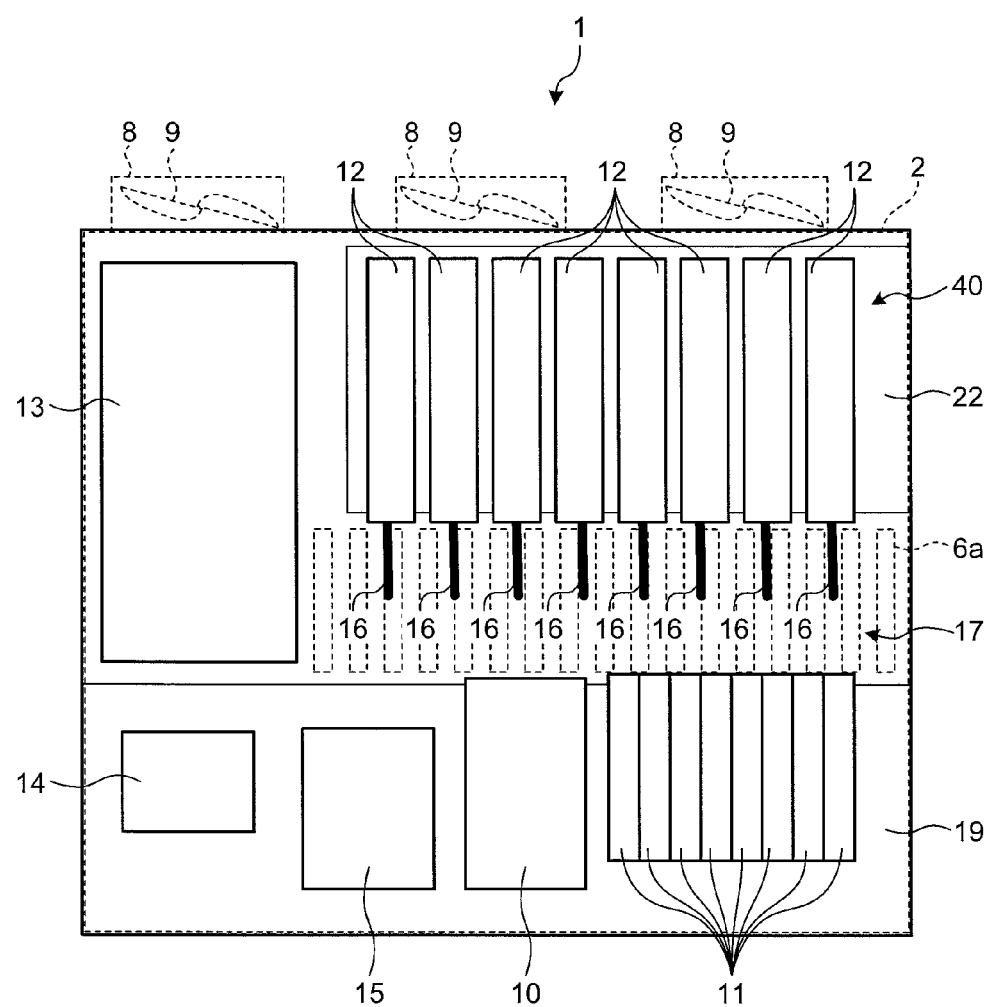
FIG. 2 is a schematic view illustrating an internal structure of the robot control device according to the embodiment as viewed in a plan view.
Figure 3:
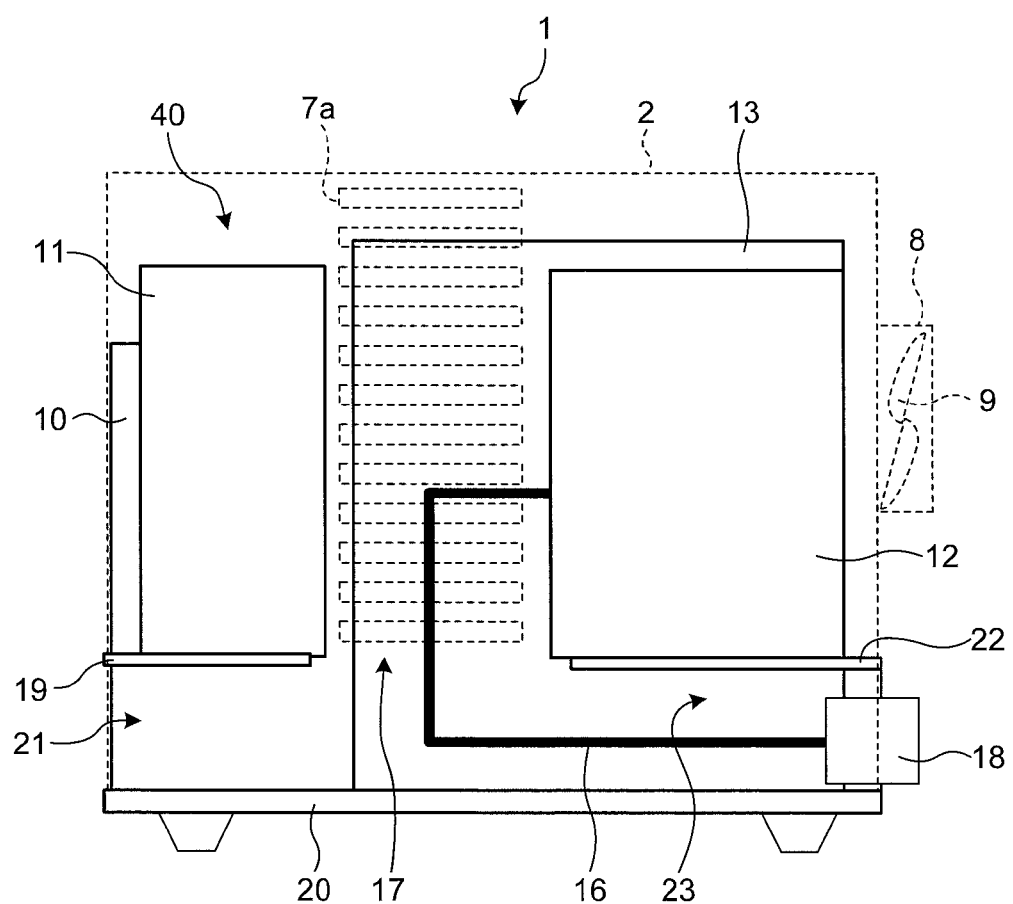
FIG. 3 is a schematic view illustrating the internal structure of the robot control device according to the embodiment as viewed in a side view.

Next, the internal structure of the robot control device 1 is explained in conjunction with FIG. 2 and FIG. 3. FIG. 2 is a schematic view illustrating the internal structure of the robot control device 1 according to the embodiment as viewed in a plan view. FIG. 3 is a schematic view illustrating the internal structure of the robot control device 1 according to the embodiment as viewed in a side view. Here, in FIG. 2 and FIG. 3, the casing 2 and the fans 9 are indicated by broken lines.

As illustrated in FIG. 2 an FIG. 3, the robot control device 1 includes the control circuit 40 including the circuit elements that is allocated in the inside of the casing 2 and controls the robot to be controlled. To be more specific, the robot control device 1 includes the circuit elements such as a CPU (Central Processing Unit) 10, control boards 11, amplifiers 12, a converter 13, a relay 14, and a capacitor 15. Here, in FIG. 2 and FIG. 3, general constitutional elements such as wiring for connecting the respective circuit elements to each other are not illustrated in the drawing.

The circuit elements generate heat when operating. Among these circuit elements, heating values of the converter 13 and the amplifier 12 are larger than that of the other circuit elements. Accordingly, in the robot control device 1, the converter 13 and the amplifiers 12 are arranged on the exhaust portion 8 side thus suppressing the influence of the heat generated by the converter 13 and the amplifier 12 on the other circuit elements.

The CPU 10 is a processing unit that performs various arithmetic operations for action control of the robot. The control board 11 provided for each axis of the robot is a processing unit that outputs a control signal to the amplifier 12 corresponding to each axis based on an arithmetic result obtained by the CPU 10.

The converter 13 is a processing unit that supplies a single-phase direct current obtained by converting an alternating current input from the outside of the casing 2 via the relay 14 to the CPU 10 and supplies a three-phase direct current obtained by converting the alternating current to the amplifiers 12.

The relay 14 is a switch for switching the input and interruption of the alternating current supplied to the converter 13. The capacitor 15 is a smoothing capacitor for smoothing the direct current converted by the converter 13.

The amplifier 12 provided for each axis and robot hand of the robot to be controlled is a processing unit that amplifies the control signal input from the control board 11 corresponding to each axis and robot hand of the robot and outputs the signal to a servo motor that drives the axis or the robot hand of the robot corresponding to the servo motor. Further, each amplifier 12 and an external output terminal 18 are connected with each other by using a cable 16.

Each of the cable 16 is arranged in a central region in the inside of the casing 2 as viewed in a plan view. Further, in the robot control device 1, a space for arranging the cables 16 is used as a ventilation passage 17 through which the outside air passes.

In other words, in the robot control device 1, the ventilation passage 17 is the space in which the control circuit 40 is not arranged in the inside of the casing 2. Further, the ventilation passage 17 is formed in the central region in the inside of the casing 2 in a transverse manner in a state that the ventilation passage 17 extends from the side plate 4 in which the intake portion 7 is arranged toward the side plate at the opposite side of the side plate 4. The ventilation passage 17 is also formed in such a manner that the ventilation passage 17 contacts inner surfaces of the side plate 4 and the top plate 3 in which the intake portions 7 and 6, respectively, are arranged.

Further, in the robot control device 1, a plurality of slits 6a that functions as the intake portion 6 are formed in a strip-shaped region, which contacts the ventilation passage 17, of the top plate 3, and a plurality of slits 7a that function as the intake portion 7 are formed in a strip-shaped region, which contacts the ventilation passage 17, of the side plate 4.

Here, in the robot control device 1, although the ventilation passage 17 is formed in the central region in the inside of the casing 2 in a transverse manner as viewed in a plan view, it is not always necessary to form the ventilation passage 17 exactly in the central region in the inside of the casing 2 in a transverse manner.

In this manner, in the robot control device 1, the region for arranging the cables 16 has much space compared with the region for arranging each circuit element and hence, the region for arranging the cables 16 is effectively used as the ventilation passage 17 through which the outside air passes. Accordingly, in the robot control device 1, even when the respective circuit elements are closely arranged to miniaturize the casing 2, the ventilation passage 17 through which the outside air passes is ensured thus releasing the heat generated in the inside of the casing 2 to the outside of the casing 2.

Therefore, in the robot control device, it is possible to suppress the temperature increase in the inside of the casing 2 during operation and, at the same time, it is possible to miniaturize the device thus decreasing a cost of the device by miniaturizing the casing 2.

Further, in the robot control device 1, the ventilation passage 17 is formed in the central region in the inside of the casing 2 in a transverse manner and, out of the circuit elements of the control circuit 40, the circuit elements that generate heat when operating are arranged on any of both sides of the ventilation passage 17 in a sandwiched manner. Here, the circuit elements that generate heat when operating are, for example, the amplifier 12, the control board 11, the CPU 10, the capacitor 15 and the like. Further, the converter 13 having comparatively large heating value is arranged in such a manner that a side surface of the converter 13 on a central region side of the casing 2 faces the ventilation passage 17.

Due to such a constitution, in the robot control device 1, it is possible to release heat easily from the central region of the casing 2 from which the heat is hard to be released compared with the vicinity of the inner peripheral surface of the casing 2 to the outside of the casing 2.

That is to say, since the casing 2 has a certain level of heat radiation function, heat generated by each circuit element is comparatively easily released from a portion of each circuit element that faces the casing 2 by way of the casing 2. On the other hand, it is difficult to release heat from a portion of each circuit element that does not face the casing 2; that is, a portion of each circuit element that faces the central region in the inside of the casing 2, compared with the portion of each circuit element that faces the casing 2.

Accordingly, the robot control device 1 is configured to form the ventilation passage 17 in the central region in the inside of the casing 2 in a transverse manner and hence, it is possible to release heat from the central region of the casing 2 from which the heat is hard to be released to the outside of the casing 2. Due to such a constitution, in the robot control device 1, it is possible to release heat generated in the inside of the casing 2 to the outside of the casing 2 in an effective manner thus suppressing the temperature increase in the inside of the casing 2.

Further, the robot control device 1 includes mounting bases 19 and 22 that mount the circuit elements on any of both sides of the ventilation passage 17 as viewed in a plan view. In addition, in the robot control device 1, the circuit elements such as the relay 14, the capacitor 15, the CPU 10, and the control boards 11 are mounted on the mounting base 19 thus forming a space 21 communicating with the ventilation passage 17 between a bottom plate 20 of the casing 2 and the circuit elements.

Further, in the robot control device 1, the amplifiers 12 are mounted on the other mounting base 22 thus forming a space 23 communicating with the ventilation passage 17 between the bottom plate 20 of the casing 2 and the circuit element.

In this manner, in the robot control device 1, the spaces 21 and 23 communicating with the ventilation passage 17 are formed between the bottom plate 20 and the circuit elements thus releasing heat from a region in the vicinity of the bottom plate 20 in which the heat is liable to accumulate in the inside of the casing 2 to the outside of the casing 2 through the ventilation passage 17.

Figure 4:
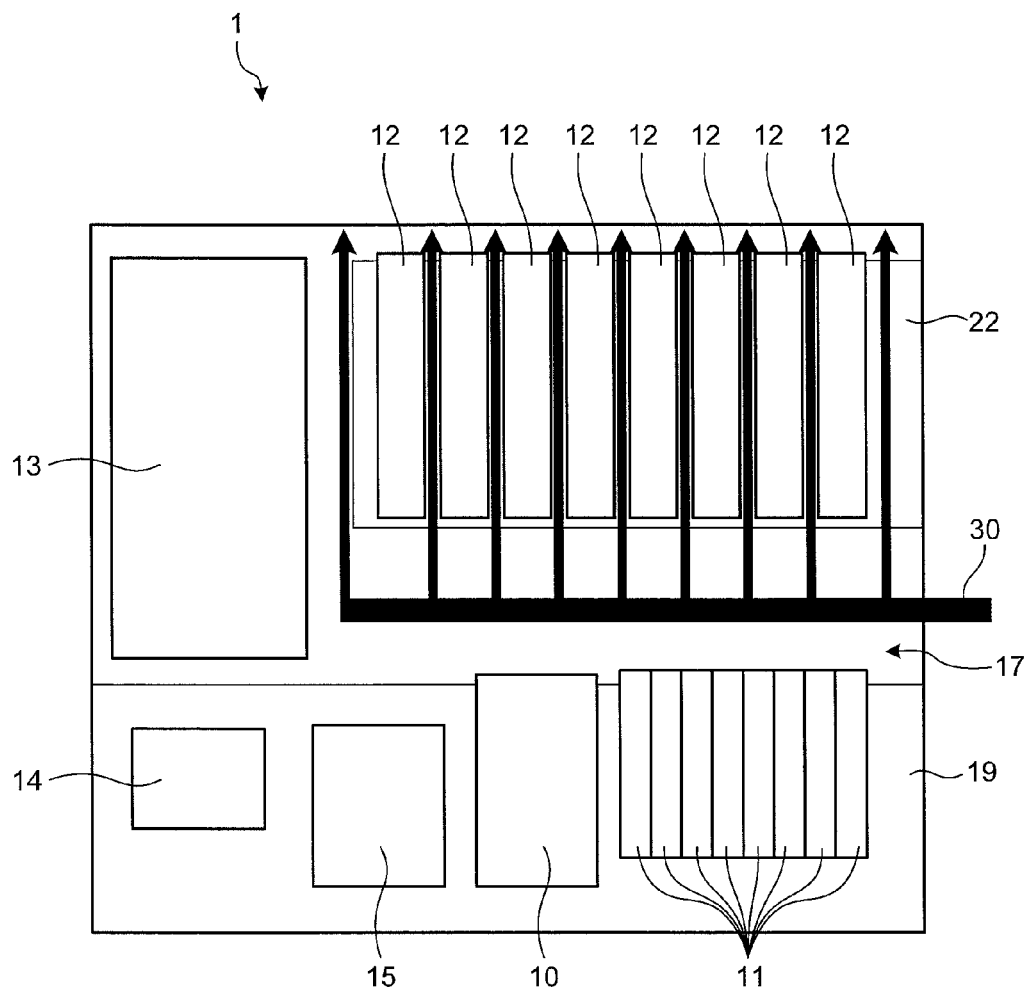
FIG. 4 is a schematic view illustrating the flow of outside air in the inside of a casing according to the embodiment as viewed in a plan view.
Figure 5:
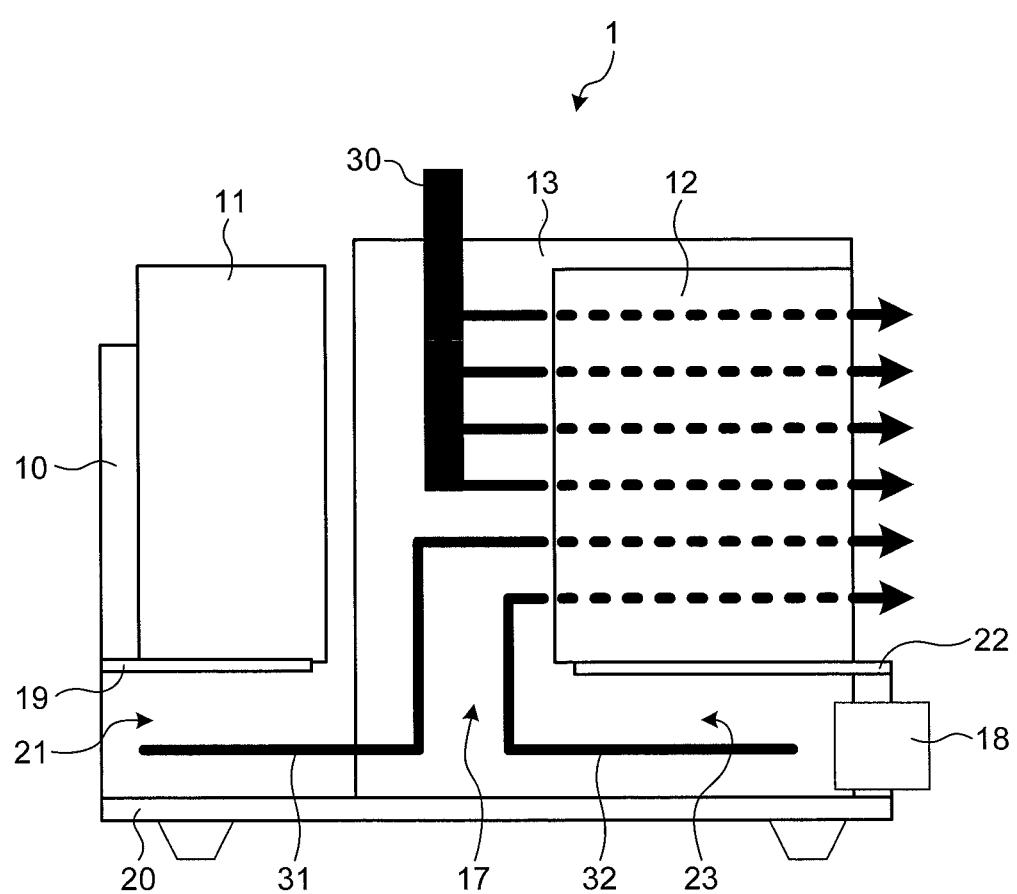
FIG. 5 is a schematic view illustrating the flow of outside air in the inside of the casing according to the embodiment as viewed in a side view.

Next, the flow of the outside air in the inside of the casing 2 is explained in conjunction with FIG. 4 and FIG. 5. FIG. 4 is a schematic view illustrating the flow of the outside air in the inside of the casing 2 according to the embodiment as viewed in a plan view, and FIG. 5 is a schematic view illustrating the flow of the outside air in the inside of the casing 2 according to the embodiment as viewed in a side view.

As shown in FIG. 4, in the robot control device 1, when the fans 9 (see FIG. 2) are driven, the outside air 30 is sucked from the intake portion 7 (see FIG. 1) arranged in the side plate 4 of the casing 2 into the inside of the casing 2.

Further, the outside air 30 is allowed to flow through the ventilation passage 17 formed in the central region in the inside of the casing 2 in a transverse manner and thereafter, the outside air 30 changes the direction thereof toward the side plate 5 (see FIG. 1) in which the exhaust portions 8 are arranged and is released from the exhaust portions 8 to the outside of the casing 2 through both sides of each amplifier 12 and the side surface of the converter 13.

In addition, as shown in FIG. 5, in the robot control device 1, the fans 9 (see FIG. 2) are driven and hence, the outside air 30 is sucked from the intake portion 6 (see FIG. 1) arranged in the top plate 3 of the casing 2 into the inside of the casing 2.

Further, the outside air 30 is allowed to flow through the ventilation passage 17 formed in the central region in the inside of the casing 2 in such a manner that the ventilation passage penetrates in the longitudinal direction and thereafter, the outside air 30 changes the direction thereof toward the side plate 5 (see FIG. 1) in which the exhaust portions 8 are arranged and is released from the exhaust portions 8 to the outside of the casing 2 through both sides of each amplifier 12 and the side surface of the converter 13.

Due to such a constitution, the outside air 30 sucked into the inside of the casing 2 absorbs heat generated by each circuit element in the central region of the casing 2 while the outside air 30 passes through the ventilation passage 17. Subsequently, the outside air 30 absorbs heat generated by each amplifier 12 and the converter 13 while the outside air 30 passes through both sides of each amplifier 12 and the side surface of the converter 13 and is released to the outside of the casing 2.

Furthermore, the robot control device 1 is provided with the space 21 formed between the mounting bases 19 on which the circuit elements are mounted and the bottom plate 20 of the casing 2 and the space 23 formed between the mounting base 22 on which the circuit elements are mounted and the bottom plate 20 of the casing 2, wherein the spaces 21 and 23 are communicated with the ventilation passage 17.

Accordingly, in the robot control device 1, when the fans 9 (see FIG. 1) are driven, an air pressure in the inside of the casing 2 drops and hence, flows of the air 31 and the air 32 toward the exhaust portions 8 from the spaces 21 and 23 formed between the mounting bases 19, 22 and the bottom plate 20 are formed.

Therefore, in the robot control device 1, heat is released from the region in the vicinity of the bottom plate 20 in which the heat is liable to accumulate in the inside of the casing 2 to the outside of the casing 2 through the ventilation passage 17 and the exhaust portions 8 and hence, the temperature increase in the inside of the casing 2 can be further suppressed.

In this manner, the heat generated from the central region of the casing 2 and the region in the vicinity of the bottom plate 20 from which the heat is hard to be released compared with the vicinity of the inner peripheral surface of the casing 2 is released to the outside of the casing 2 thus suppressing deterioration in the operating environment of the control circuit 40 due to the temperature increase in the inside of the casing 2.

Here, in the present embodiment, constitutional features described below are not shown in the drawings; that is, in the side plates in which the intake portion 7 and the exhaust portions 8 are not arranged out of four side plates, an opening for visually checking a status display device on which connection states of signal lines and operating states of the control circuit 40 are displayed from the outside of the casing 2 is formed.

Due to such a constitution, in the robot control device 1, when the fans 9 are driven, the outside air 30 is sucked also from the opening for visually checking the status display device into the inside of the casing 2 and released from the exhaust portions 8. Due to such a flow of air also, it is possible to release the heat generated in the inside of the casing 2 to the outside of the casing 2.

Here, in a robot having a plurality of joints or robot hands, as the robot controlled by the robot control device 1, servo motors that operate the respective joints or the robot hands require power consumption different from each other.

For example, in the case of a robot provided with the robot arm having the joints, the servo motor arranged at a position close to a proximal end side of the robot arm requires a torque larger than that required by the servo motor arranged at a position close to a distal end side of the robot arm. Therefore, the servo motor arranged at a position close to the proximal end side of the robot arm requires larger power consumption.

Accordingly, in the robot control device 1, it is necessary for the amplifier 12 that outputs a control signal to the servo motor arranged at a position close to the proximal end side of the robot arm to output the control signal having power higher than that of the control signal output from the amplifier 12 that outputs the control signal to the servo motor arranged at a position close to the distal end side of the robot arm.

Therefore, the amplifier 12 that outputs the control signal to the servo motor arranged at a position close to the proximal side of the robot arm has a heating value larger than that of the amplifier 12 that outputs the control signal to the servo motor arranged at a position close to the distal end side of the robot arm when the amplifier 12 is in operation.

Accordingly, in the robot control device 1, arrangement positions of a plurality of the amplifiers 12 that output the control signal to each servo motor are determined based on the heating value of each amplifier 12 and hence, the heat generated in the inside of the casing 2 can effectively be released to the outside of the casing 2.

Figure 6:
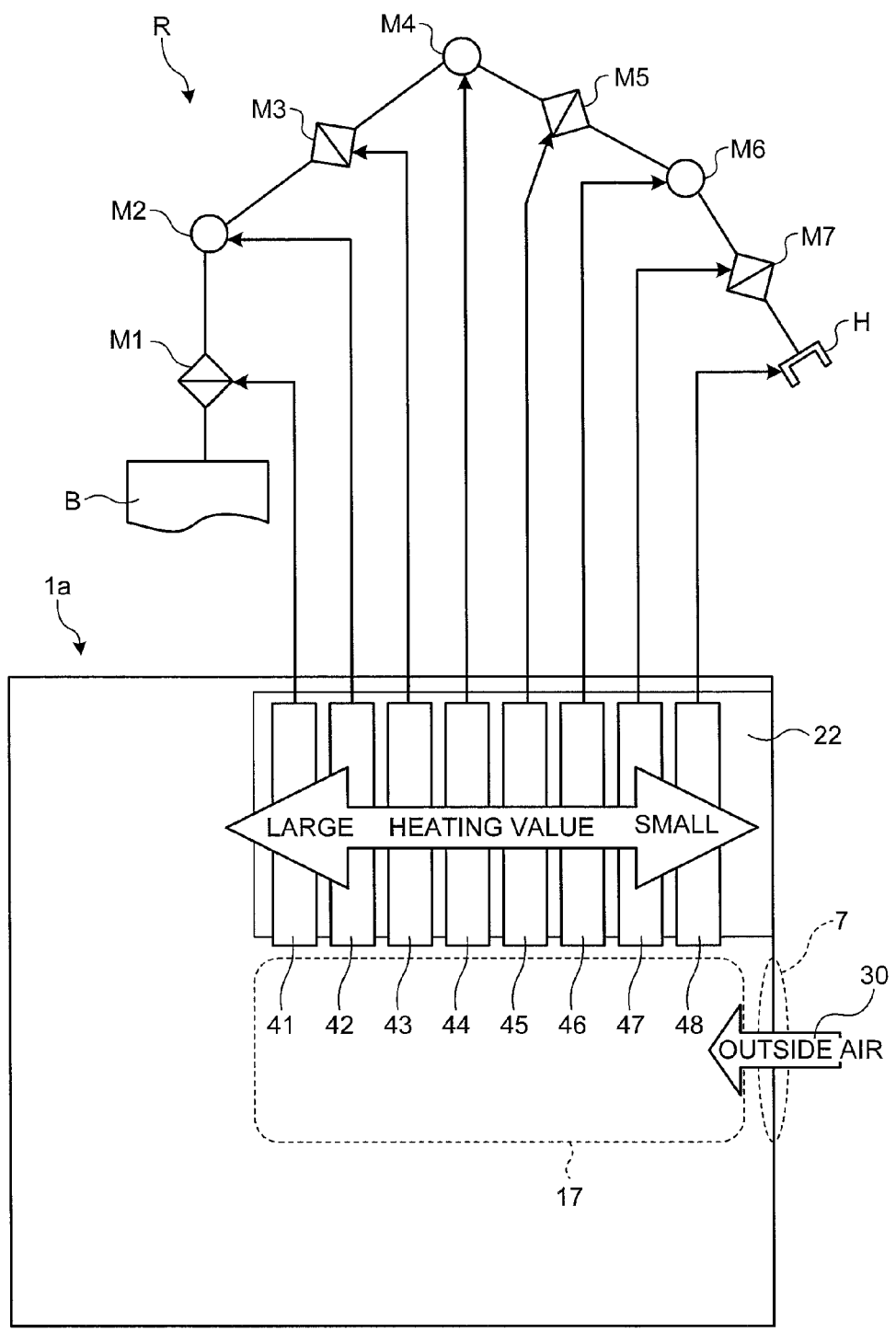
FIG. 6 is a schematic view illustrating the robot control device according to the embodiment, wherein each amplifier is arranged at a position determined based on a heating value thereof.

Here, in conjunction with FIG. 6, a robot control device 1a having amplifiers 12 each of which is arranged at the arrangement position determined based on the heating value thereof is explained. FIG. 6 is a schematic view illustrating the robot control device 1a according to the embodiment, wherein the arrangement position of each amplifier 12 is determined based on the heating value thereof.

Hereinafter, the embodiment is explained by taking the robot control device 1a that controls an action of a robot R provided with a robot hand H mounted on a distal end portion of a 7-axis robot arm whose proximal end portion is fixed to a base B as an example. The robot arm is provided with seven servo motors M1 to M7 each of which drives each axis.

Here, in FIG. 6, eight amplifiers 12 are given numerals 41 to 48 in descending order of heating value. Further, the robot control device 1a is constituted in the same manner as the case of the robot control device 1 described above except that the arrangement positions of the amplifiers 41 to 48 of the robot control device 1a are different from those of the robot control device 1. Accordingly, in FIG. 6, constitutional components except the amplifiers 41 to 48 are not illustrated in the drawing.

In the example illustrated in FIG. 6, the heating values of the amplifiers 41 to 48 become larger as the servo motors M1 to M7 and the robot hand H to be controlled are arranged closer to the base B. In such a case, in the robot control device 1a, the amplifiers 41 to 48 are arranged in a row along the ventilation passage 17 in such a manner that the amplifiers 41 to 48 are arranged next to each other from the position distant from the intake portion 7 in descending order of heating value in operation.

Due to such a constitution, in the robot control device 1a, even when the temperature of the outside air 30 sucked from the intake portion 7 is increased while the outside air 30 passes through the ventilation passage 17, at a point of time that the outside air 30 reaches the arrangement position of the amplifier 41 having the largest heating value, the temperature of the outside air 30 is not increased to be higher than the temperature of the amplifier 41.

In this manner, in the robot control device 1a, it is possible to supply the outside air 30 whose temperature is lower than the temperature of the respective amplifiers 41 to 48 to the area around the amplifiers 41 to 48 and hence, the heat generated in the inside of the casing 2 can effectively be released to the outside of the casing 2.

As described above, each of the robot control devices 1 and 1a according to the present embodiment includes the casing 2 having the top plate 3 and one side plate 4 in which the intake portions 6 and 7, respectively, are arranged, and the side plate 5 adjacent to the side plate 4 in which the intake portion 7 is arranged, wherein the exhaust portions 8 are arranged in the side plate 5.

In addition, each of the robot control devices 1 and 1a according to the present embodiment includes the control circuit 40 that is allocated in the inside of the casing 2 and controls the robot R to be controlled, and the fans 9 that release the outside air 30 sucked from the intake portions 6 and 7 to the outside of the casing 2 through the exhaust portions 8.

Further, in each of the robot control devices 1 and 1a, the outside air 30 is sucked into the inside of the casing 2 by driving the fans 9, the heat generated in the inside of the casing 2 is absorbed by the outside air 30, and the outside air 30 that accumulates the heat is released to the outside of the casing 2 through the exhaust portions 8.

Due to such a constitution, in each of the robot control devices 1 and 1a, it is possible to suppress the temperature increase in the inside of the casing 2 when operating the device thus suppressing deterioration in the operating environment of the control circuit 40.

Here, the robot control devices 1 and 1a according to the embodiment described above merely constitute one example each, and various modifications are conceivable. Hereinafter, in conjunction with FIG. 7, a robot control device 1b according to the modification is explained.

Figure 7:
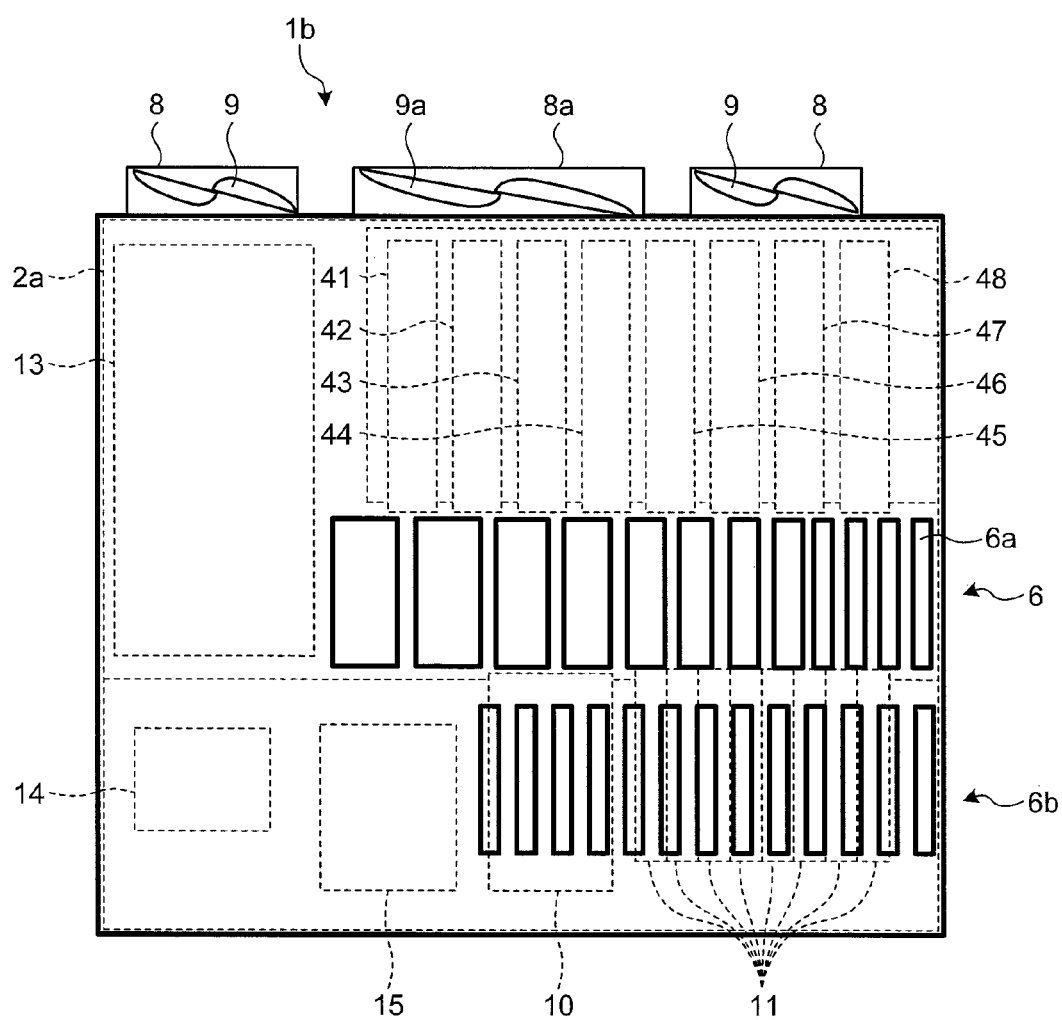
FIG. 7 is a schematic view illustrating the robot control device according to a modification.

FIG. 7 is a schematic view illustrating the robot control device 1b according to the modification. Here, in FIG. 7, constitutional components having the identical functions are given same numerals. As shown in FIG. 7, in the robot control device 1b, only a casing 2a and a fan 9a are constituted in a manner different from the cases of the robot control devices 1 and 1a.

To be more specific, the casing 2a of the robot control device 1b is also provided with an intake portion 6b arranged in a portion of the top plate 3 corresponding to the control boards 11 and the CPU 10 in addition to the portion whose inner surface contacts the ventilation passage 17 (see FIG. 2).

Due to such a constitution, in the robot control device 1b, it is possible to suck in the outside air 30 from an area immediately above the control boards 11 and the CPU 10 and hence, the heat generated by the control boards 11 and the CPU 10 can effectively be released to the outside of the casing 2. Therefore, according to the robot control device 1b, it is possible to prevent the control circuit 40 from thermal runaway due to the increase in temperature in the vicinity of the control boards 11 and the CPU 10.

Further, the intake portion 6, which is arranged in a portion of the top plate 3 whose the inner surface contacts the ventilation passage 17 (see FIG. 2), is formed in such a manner that an area of a slit 6a becomes large as the position of the slit 6a comes close to the amplifier 41 having the largest heating value in operation.

Due to such a constitution, in the robot control device 1b, it is possible to increase a flow rate of the outside air 30 sucked into the casing 2 as a position into which the outside air 30 is sucked comes close to the amplifier 41 having the largest heating value in operation. Therefore, according to the robot control device 1b, the respective amplifier 41 to 48 are cooled by the outside air 30 having the flow rate corresponding to an amount of heat generated from the respective amplifiers 41 to 48 and hence, the temperature in the inside of the casing 2 can evenly be lowered.

Further, in the robot control device 1b, out of the eight amplifiers 41 to 48, the area of an exhaust portion 8a corresponding to the four amplifiers 41 to 44 having comparatively large heating values is made larger than that of the exhaust portion 8 corresponding to the four amplifiers 45 to 48 having comparatively small heating value.

Furthermore, the robot control device 1b includes a fan 9a placed in a position corresponding to the exhaust portion 8a whose area is made larger than that of the other exhaust portion 8, wherein the fan 9a has a size larger than that of the fan 9 corresponding to the other exhaust portion 8. Due to such a constitution also, in the robot control device 1b, the temperature in the inside of the casing 2 can evenly be lowered.

Here, in the robot control device 1b, the areas of the exhaust portions 8 and 8a may be made equal to each other and, at the same time, the sizes of the fans 9 and 9a may be made equal to each other. In such a case, the fan 9a is controlled so that a rotational speed per unit time of the fan 9a corresponding to the four amplifiers 41 to 44 having comparatively large heating values in operation is higher than that of the other fan 9. Due to such a constitution also, the temperature in the inside of the casing 2 can evenly be lowered.

Further, the modification is not limited to the robot control device 1b illustrated in FIG. 7. For example, in the robot control device 1 according to the embodiment, the intake portions 6 and 7 may be formed in such a manner that the total area of the intake portion 6 arranged in the top plate 3 of the casing 2 is made equal to that of the intake portion 7 arranged in one side plate 4 by adjusting the areas of the slits 6a and 7a.

Due to such a constitution, the amount of the outside air 30 sucked in from the top plate 3 side of the casing 2 and the amount of the outside air 30 sucked in from the side plate 4 side of the casing 2 can be made equal to each other and hence, the temperature in the inside of the casing 2 can evenly be lowered.

In addition, due to such a constitution, in the case where the length of the ventilation passage 17 as viewed in a plan view is larger than the height of the ventilation passage 17 as viewed in a side view, the areas of the respective slits 6a arranged in the top plate 3 can be made smaller than those of the respective slits 7a arranged in the side plate 4.

Accordingly, when the robot control device 1 is not in operation, it is possible to control the size of foreign matter intruding into the inside of the casing 2 from the slits 6a arranged in the top plate 3 thus suppressing intrusion of the foreign matter into the inside of the casing 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A robot control device comprising:
   a casing including a top plate provided with a first intake portion and a first side plate provided with a second intake portion;
   a control circuit that is received inside the casing to control a robot; and
   a fan configured to release outside air sucked into the casing from the first intake portion and the second intake portion to an outside of the casing through an exhaust portion, wherein
   the exhaust portion is arranged in a second side plate adjacent to the first side plate,
   the casing includes a ventilation passage that defines a first space in which the control circuit is not arranged, that extends from the first side plate toward a third side plate that is opposite the first side plate, and contacts an inner surface of the first side plate and an inner surface of the top plate; and
   the first intake portion includes slits arranged in a strip-shaped region of the top plate that contacts the ventilation passage, and
   the second intake portion includes slits arranged in a strip-shaped region of the first side plate that contacts the ventilation passage.

2. The robot control device according to claim 1, wherein the control circuit includes circuit elements, and
   the circuit elements generate heat in operation and are arranged on both sides of the ventilation passage in a sandwiched manner.

3. The robot control device according to claim 2, wherein the circuit elements having a larger heating value in operation are arranged at a position more distant from the second intake portion.

4. The robot control device according to claim 1, wherein a second space communicating with the ventilation passage is formed between a bottom plate of the casing and the control circuit.

5. The robot control device according to claim 2, wherein a second space communicating with the ventilation passage is formed between a bottom plate of the casing and the control circuit.

6. The robot control device according to claim 3, wherein a second space communicating with the ventilation passage is formed between a bottom plate of the casing and the control circuit.

* * * * *